United States Patent
Yaegashi et al.

[19]

[11] Patent Number: 6,017,663

[45] Date of Patent: Jan. 25, 2000

[54] METHOD OF PROCESSING RESIST UTILIZING ALKALINE COMPONENT MONITORING

[75] Inventors: Hidetami Yaegashi, Kokubunji; Yasunori Kawakami, Kikuchi; Jae Hoon Park, Misato; Keiko Kanzawa, Yamanashi-ken; Takayuki Katano, Nirasaki; Takayuki Toshima, Yamanashi-ken; Yuji Kakazu, Ageo, all of Japan

[73] Assignee: Tokyo Electron Limited, Tokyo, Japan

[21] Appl. No.: 09/277,735

[22] Filed: Mar. 29, 1999

Related U.S. Application Data

[63] Continuation of application No. 08/823,470, Mar. 24, 1997, Pat. No. 5,932,380.

[30] Foreign Application Priority Data

Mar. 25, 1996 [JP] Japan ..................................... 8-094752

[51] Int. Cl.$^7$ ...................................................... G03F 9/00
[52] U.S. Cl. .............................................. 430/30; 430/311
[58] Field of Search ........................................ 430/30, 311

[56] References Cited

U.S. PATENT DOCUMENTS

| | | |
|---|---|---|
| 5,143,552 | 9/1992 | Moriyama . |
| 5,326,316 | 7/1994 | Hashimoto et al. ..................... 454/187 |
| 5,434,644 | 7/1995 | Kitano et al. ............................. 355/30 |

FOREIGN PATENT DOCUMENTS 2 217 107   10/1989   United Kingdom .

OTHER PUBLICATIONS

Total Molecular Base Real Time Monitor [TMB], Extraction Systems Inc.

Kim R. Dean, et al.—"Real–Time Detection of Airborne Contaminants in DUV Lithographic Processing Environments" 1995, Proceedings of the 41$^{st}$ Annual Technical Meeting of the Institute of Environmental Sciences; Anaheim, CA, USA Apr. 30–May 5, 1995, pp. 9–16.

Joe C. Vigil, et al.—"Contamination Control for Processing DUV Chemically Amplified Photoresists" Advances in Resist Technology and Processing XII, Santa Clara, CA, USA, Feb. 20–22, 1995, ISSN 0277–786X, Proceedings of the SPIE—The International Society for Optical Engineering, 1995, USA, pp. 626–643.

Patent Abstracts of Japan, vol. 018, No. 566 (E–1622), Oct. 28, 1994 & JP 06 208947 A (Toshiba Corp.), Jul. 26, 1994.

*Primary Examiner*—Christopher G. Young
*Attorney, Agent, or Firm*—Oblon, Spivak, McClelland, Maier & Neustadt, P.C.

[57] ABSTRACT

A method of forming a resist on a substrate and processing the resist in a resist processing system having a processing region and a non-processing region which are air-conditioned, the method comprising the steps of, transferring the substrate into the non-processing region, coating the resist on the substrate, exposing the coated resist, developing the exposed resist, subjecting the coated resist at least once, to heat treatment in a period from the transferring step to the developing step, detecting at least once, the concentration of an alkaline component which causes defective resolution of the resist in a processing atmosphere in a period from the transferring step to the developing step, setting a threshold value for the concentration of the alkaline component in the processing atmosphere which causes the defective resolution of the resist, and controlling and changing at least one processing atmosphere in the steps in accordance with a detected concentration of the alkaline component and the threshold value.

28 Claims, 7 Drawing Sheets

METHOD OF PROCESSING RESIST UTILIZING ALKALINE COMPONENT MONITORING

This application is a continuation of application Ser. No. 08/823,470 filed on Mar. 24, 1997, now U.S. Pat. No. 5,932,380.

BACKGROUND OF THE INVENTION

1. Field of the Invention

The present invention relates to a method of processing a resist onto a substrate such that a photoresist is coated with a substrate such as a semiconductor wafer and then the coated photoresist is exposed and developed, and to a resist processing apparatus.

2. Discussion of the Background

As the density of electric devices mounted on a substrate has been rapidly raised, the photolithography technology has been improved energetically. For example, a process for manufacturing 64 MDRAM or 256 MDRAM has been performed such that a chemically amplified resist is used in place of the conventional novolac system photoresist.

If the chemically amplified resist is exposed to light, acid generated from the sensitive material is diffused due to heating to act on a catalyst, thus causing a base resin to be decomposed or causing the molecular structure of the base resin to be changed. It leads to a fact that the base resin is made to be soluble or insoluble with respect to the developer.

Since one molecule of the catalyst of the chemically amplified resist contributes to a plurality of chemical reactions, higher photosensitivity is realized as compared with conventional resists. Moreover, the chemically amplified resist, having a high light transmittance in a short wavelength region, is able to relax the light intensity distribution in the direction of the thickness of the film even if an eximer laser beam having a short exposing wavelength is used. Thus, line widths of a level of 0.3 mm can be realized when a circuit pattern is formed.

However, the chemically amplified resist, depending on the environment by a degree greater than the conventional resists, has a risk that organic amine, such as ammonia and NMP (N-methyl.2 pyrrolidinone), and their polar materials (hereinafter simply called as "alkaline components"), each existing in the processing atmosphere in a small quantity, and the chemically amplified resist cause neutralization reactions to take place and thus the resist is devitalized. If the resist is devitalized, accurate line widths of a highly-integrated circuit pattern cannot be realized in the developing process. Thus, a so-called defective resolution takes place.

The inventors of the present invention have developed and researched the foregoing problem, thus resulting in consideration being performed such that the following three facts relate to the alkaline component which is mixed in the processing atmosphere. First, use of a solution containing ammonia as a washing liquid for removing particles allowed to adhere to non-processed wafer causes alkaline component to be generated in the processing atmosphere. A second fact is such that use of hexamethyldisilazane (HMDS) in the adhesion process which is performed before the resist is applied causes the alkaline component to be generated in the processing atmosphere. A third fact is that a process for forming a reflection preventive film on the surface of the wafer by using amine solvent results in the alkaline component being generated in the processing atmosphere.

In U.S. Pat. No. 5,434,644, a resist processing apparatus has been disclosed which comprises a special chemical filter capable of removing alkaline component in the resist processing atmosphere. The element of the chemical filter is impregnated with acid components, such as phosphoric acid, so as to remove the alkaline component attributable to the neutralizing reaction with the acid component so that clean downflow air is introduced into a processing portion. If the foregoing apparatus is used for a long time, and thus the filter element deteriorates causing the removal performance also deteriorates, the filter element must be changed at proper timing because the concentration of the alkaline component in the processing atmosphere is raised gradually.

Hitherto, an operator of the apparatus samples each point of the internal atmosphere in each apparatus. Then, the concentration of the alkaline component included in each sample is analyzed. In accordance with a result of the analysis, the filter element is changed. However, the conventional method takes an excessively long time to obtain the result of the detection of the alkali concentration. Thus, a quick countermeasure against the rise in the concentration of the alkaline component in the processing atmosphere cannot be taken. Therefore, the manufacturing yield cannot be improved and the reliability of the apparatus has been unsatisfactory.

BRIEF SUMMARY OF THE INVENTION

An object of the present invention is to provide a method of processing a resist onto a substrate and a resist processing apparatus capable of raising manufacturing yield of semiconductor devices having a highly-integrated circuit pattern and improving the reliability of the apparatus.

According to one aspect of the present invention, there is provided a method of processing a resist onto a substrate such that the substrate is subjected to a resist process in a resist processing system having a processing region and a non-processing region which are air-conditioned, the method of processing a resist onto a substrate comprising:

(a) a step for transferring the substrate into the non-processing region;

(b) a step for coating the resist with the substrate;

(c) a step for exposing the coated resist;

(d) a step for developing the exposed resist;

(e) a step for, at least once, subjecting the coated resist to heat treatment in a period from the step (a) to the step (d);

(f) a step for, at least once, detecting the concentration of an alkaline component which causes defective resolution of the resist in a processing atmosphere in a period from the step (a) to the step (d);

(g) a step for setting a threshold value for the concentration of the alkaline component in the processing atmosphere which causes the defective resolution of the resist; and (h) a step for controlling and changing at least one processing atmosphere in the steps (a) to (e) in accordance with a detected value in the step (f) and the threshold value in the step (g).

According to another aspect of the present invention, there is provided a method of processing a resist onto a substrate such that the substrate is subjected to a resist process in a resist processing system having a processing region and a non-processing region which are air-conditioned, the method of processing a resist onto a substrate comprising:

(A) a step for transferring the substrate into the non-processing region;

(B) a step for, in the processing region, coating the resist with the substrate;

(C) a step for, in the processing region, exposing the coated resist;

(D) a step for, in the processing region, developing the exposed resist;

(E) a step for, at least once, subjecting the coated resist to heat treatment in a period from the step (A) to the step (D);

(F) a step for, at least once, detecting the concentration of an alkaline component which causes defective resolution of the resist in a processing atmosphere in a period from the step (A) to the step (D);

(G) a step for detecting the concentration of an alkaline component contained in an atmosphere of an external environment of the resist processing system;

(H) a step for setting a threshold value-for the concentration of an alkaline component in the processing atmosphere which causes the defective resolution of the resist;

(I) a step for setting a threshold value of the concentration of the alkaline component contained in the atmosphere of the external environment which causes defective resolution of the resist;

(J) a step for controlling and changing at least one processing atmosphere in the steps (A) to (E) in accordance with a detected value in the step (F) and the threshold value in the step (H); and (K) a step for controlling and changing the atmosphere of the external environment of the resist processing system in accordance with a detected value in the step (G) and the threshold value in the step (I).

According to another aspect of the present invention, there is provided a resist processing apparatus having a processing region and a non-processing region which are air-conditioned, the resist processing apparatus comprising:

a resist coating portion for coating the resist with a substrate;

a heating portion for heating the substrate subjected to an exposing process;

a cooling portion for cooling the substrate;

a developing portion for developing the substrate;

an interface portion for transferring/receiving the substrate which has been subjected to the exposing process;

means for transferring the substrate between the interface portion and each of the resist coating portion, the heating portion, the cooling portion and the developing portion;

means for supplying downflow air to the processing region;

filter means disposed at least above the processing region and arranged to remove an alkaline component contained in downflow air to be introduced into the processing region, the filter means having an element containing an acid component for reacting with the alkaline component to capture the alkaline component;

concentration detection means for detecting the concentration of an alkaline component existing in at least one atmosphere in the resist coating portion, the developing portion, the heating portion, the cooling portion and the interface portion;

means for setting a threshold value of the concentration of the alkaline component in the processing atmosphere which causes defective resolution of the resist;

means for controlling at least one processing atmosphere in the resist coating portion, the heating portion, the cooling portion and the developing portion in accordance with the set threshold value and the detected value; and display means for receiving a signal from the control means to display the detected value.

According to another aspect of the present invention, there is provided a resist processing apparatus having a processing region and a non-processing region which are air-conditioned, the resist processing apparatus comprising:

a resist coating portion for coating the resist with the substrate;

a heating portion for heating the substrate subjected to an exposing process;

a cooling portion for cooling the substrate;

a developing portion for developing the substrate;

an interface portion for transferring/receiving the substrate which has been subjected to the exposing process;

means for transferring the substrate between the interface portion and each of the resist coating portion, the heating portion, the cooling portion and the developing portion;

means for supplying downflow air to the processing region;

filter means disposed at least above the processing region and arranged to remove an alkaline component contained in downflow air to be introduced into the processing region;

means for setting a threshold value of the concentration of the alkaline component in the processing atmosphere which causes defective resolution of the resist;

first concentration detection means for detecting the concentration of the alkaline component existing in at least one atmosphere of the resist coating portion, the developing portion, the heating portion, the cooling portion and the interface portion:

second concentration detection means for detecting the concentration of the alkaline component existing in the atmosphere of an external environment of the resist processing system;

control means for controlling and changing at least one atmosphere in the resist coating portion, the developing portion, the heating portion, the cooling portion and the interface portion in accordance with values detected by the first and second concentration detection means and the set threshold value; and a display means for receiving a signal from the control means to display the detected values.

According to the present invention, the concentration of the alkaline component in the processing atmosphere for the substrate is detected, and then the detected value is compared with the threshold value. Therefore, the processing atmosphere can be controlled in an online manner. Moreover, a value which is the same or lower than the threshold value is displayed and whether or not the operation for processing the substrate is continued is determined. Then, a state of the atmosphere in the processing portion can be notified to an operator. Therefore, damage of the resist can be prevented satisfactorily.

The wafer applied with the resist and exposed to light was allowed to stand in an atmosphere in which the concentration of ammonia was about 1 ppb and in an atmosphere in which the concentration of the same was about 10 ppb. A required width of lines of the pattern of ±0.3% was satisfied in the former atmosphere (alkali concentration of 1 ppb). However, the pattern was deformed excessively in the latter atmosphere (alkali concentration of 10 ppb).

The chemically amplified resist can be selected from IX-60 (trade mark of Japan Synthetic Rubber), APEX-E (trade mark of IBM), AZ-DX46 (trade mark of HOECHST) and AXT-248 (trade mark of Seapley) etc.

The filter element may be impregnated with the acid component, such as phosphoric acid and sulfonic acid.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Referring to the drawings, preferred embodiments of the present invention will now be described.

Figure 1:
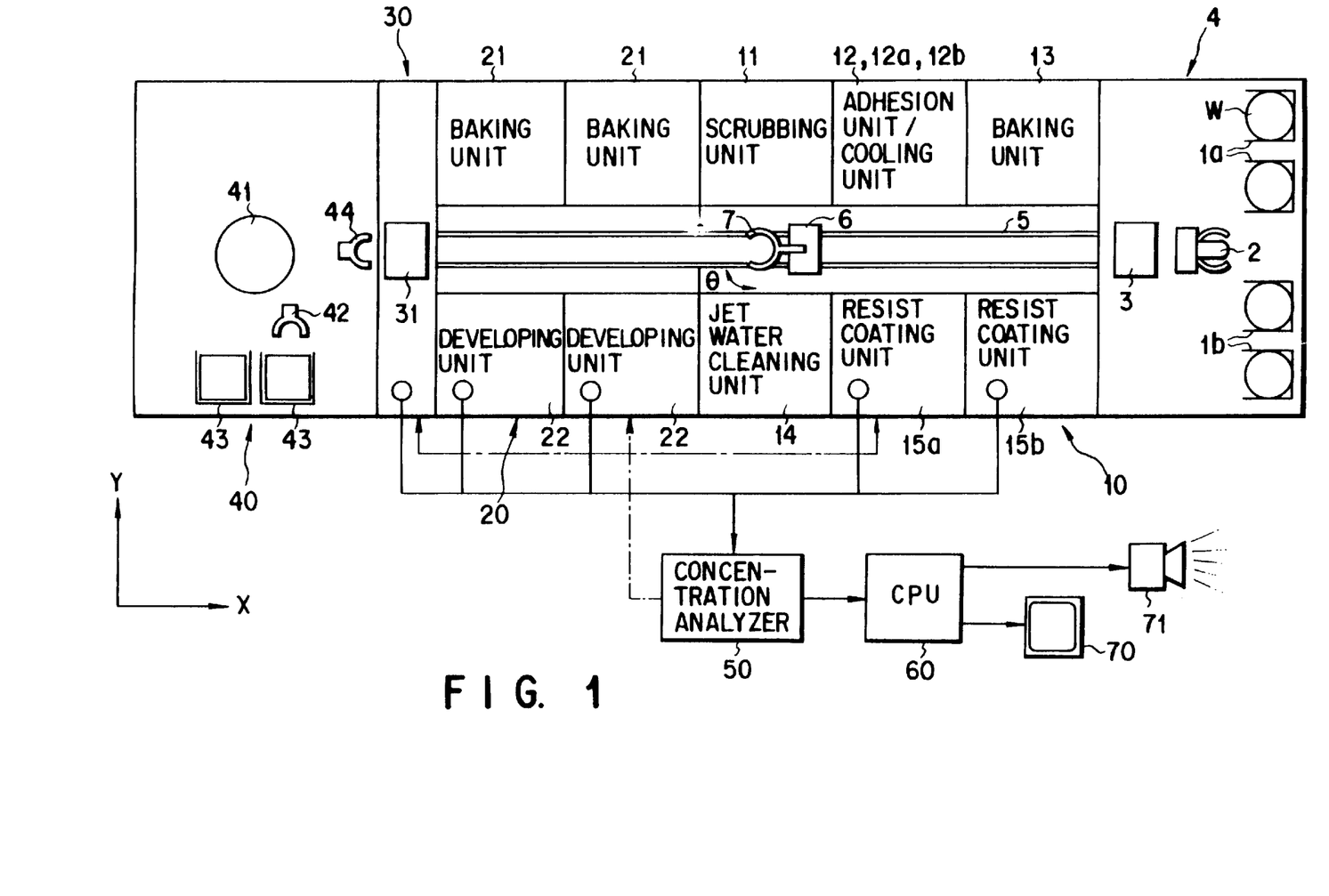
FIG. 1 is a schematic plan view showing a semiconductor wafer resist applying/developing system.

As shown in FIG. 1, a resist processing system includes a cassette station 4, a coating section 10, an interface section 30 and an exposing section 40. The cassette station 4 has a wafer moving mechanism 2 and a holder 3. A first cassette 1a for accommodating non-processed wafer W and a second cassette 1b for accommodating a processed wafer are disposed on the holder 3 at predetermined positions. The wafer moving mechanism 2 takes out the non-processed wafer W from the first cassette 1a to store the processed wafer in the first cassette 1b.

The processing section has a plurality of the processing sections 10 to 15 and 20 to 22 and a main conveying machine 6. The main conveying machine 6 is capable of running on a straight central passage 5 in the processing section, the main conveying machine 6 having an arm 7 for holding and moving the wafer W. The arm 7 is able to move in the directions of the X, Y and Z axes and rotate around the Z axis by an angular degree of d.

On one side of the central passage 5, there are formed non-heat processing sections 10, 15a, 15b, 20 and 22. On the other side of the central passage 5, there are formed heat processing sections 11, 12, 13 and 21. The coating section 10 is formed adjacent to the cassette station 4 and having two resist coating units 15a and 15b. The resist coating unit 15a applies a reflection protective film to the wafer W, while the resist coating unit 15b applies photoresist to the wafer W. The developing section 20 is formed adjacent to the interface section 30 and has two developing units 22. Each of the developing units 22 develops the wafer W subjected to the exposing process in an exposing unit 40.

The scrubbing unit 11 scrub-cleans the wafer W with rotating brushes. An adhesion processing unit 12a subjects the surface of the wafer W to a hydrophobic process using hexamethyldisilazane (HMDS). The processing atmosphere of the adhesion processing unit 12a usually includes alkaline component at a concentration of 4 ppb to 50 ppb. A cooling unit 12b cools the wafer W. Baking units 13 and 21 heat the wafer W to which the resist has been applied.

Figure 2:
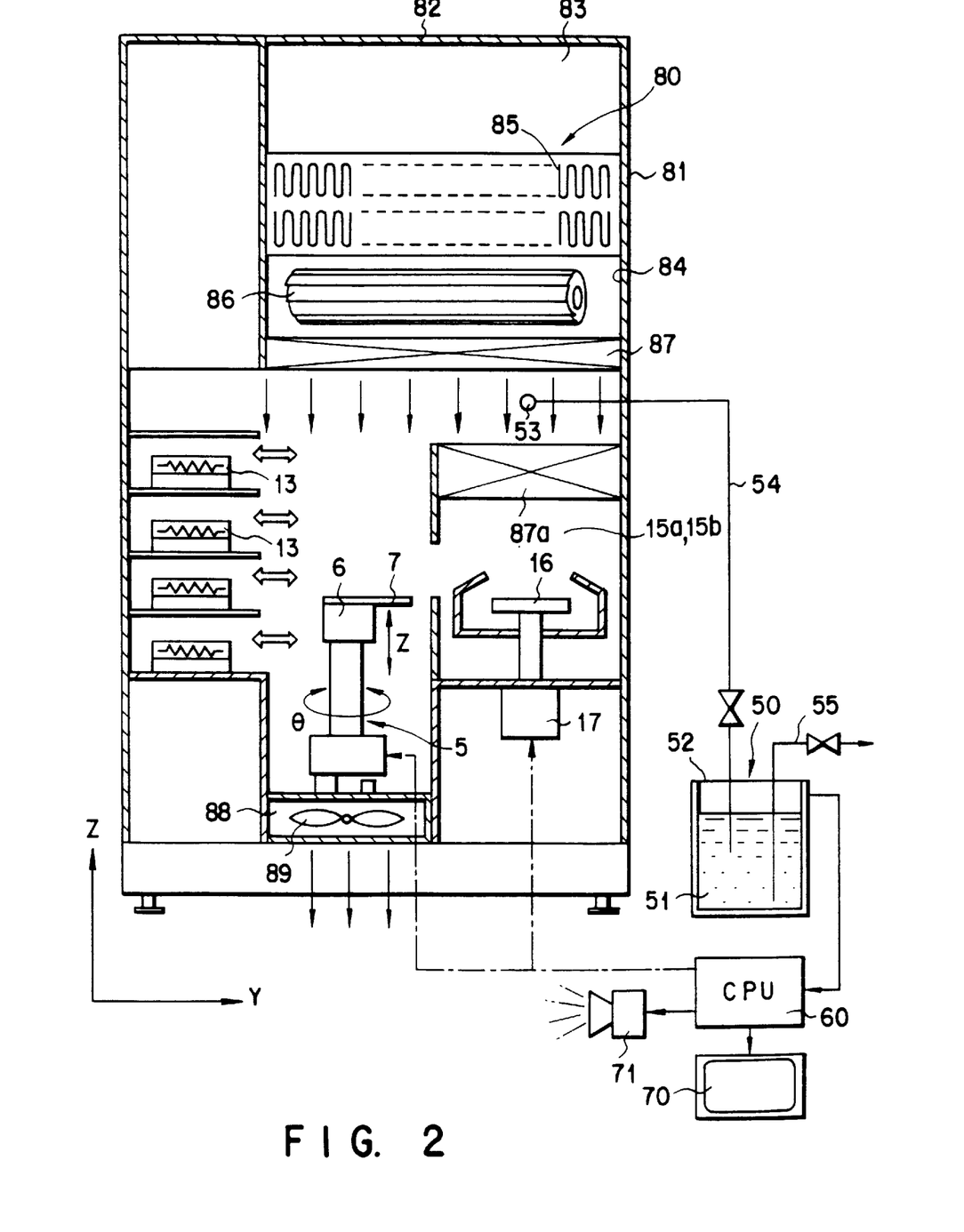
FIG. 2 is a cross sectional block diagram of a resist applying portion having a resist processing apparatus for substrates according to an embodiment of the present invention.

A jet-water cleaning unit 14 cleans the wafer W with jet stream of pure water. As shown in FIG. 2, the baking unit 13 has hot plates disposed vertically.

A plurality of the adhesion processing units 12a and the cooling units 12b are formed in the processing unit 12.

The interface unit 30 is formed adjacent to the developing unit 20 and the baking unit 21 in the processing section. The interface unit 30 has a holder 31 for transferring/receiving the wafer W.

The exposing unit 40 is connected to the processing section through the interface unit 30. The exposing biunit 40 has an exposing stage 41, two loading mechanisms 42 and 44 and a cassette station on which the cassettes 43 are placed.

The side portions of the coating unit 10 and the developing unit 20 are covered with a cover 81. The upper portion of the coating unit 10 and the developing unit 20 are covered with a cover 82. The upper cover 82 has an opening through which air is supplied from a common duct (not shown) of the plant into an air intake opening of each air cleaning mechanism 80. The air cleaning mechanism 80 is disposed above each of the processing sections 10 and 20 and the interface section 30.

As shown in FIG. 2, a duct 83 is formed in the uppermost portion of the air cleaning mechanism 80. A communication passage 84 for connecting the duct 83 to the processing units 15a and 15b has, in the downward direction, a chemical filter 85, an air blowing fan 86 and an ULPA filter 87. Moreover, another ULPA filter 87a is formed above the resist coating units 15a and 15b. The chemical filter 85 is operated to remove the alkaline component, while the ULPA filters 87 and 87a are operated to remove particles. The number of the ULPA filters 87 may be two as is employed in this embodiment or one.

An air-discharge passage 88 is formed in the floor portion of the central passage 5, the air-discharge passage 88 including an exhaust fan 89. Thus, a downflow of air is formed from the air cleaning mechanism 80 to the air-discharge passage 88. The air-discharge passage 88 is allowed to communicate with a circulating circuit (not shown) having an alkaline component removing apparatus (not shown). The alkaline component in the exhaust air is removed by the alkaline component removal apparatus, and then regenerated air is again supplied to the air cleaning mechanism 80 through the circulating circuit.

Figure 8:
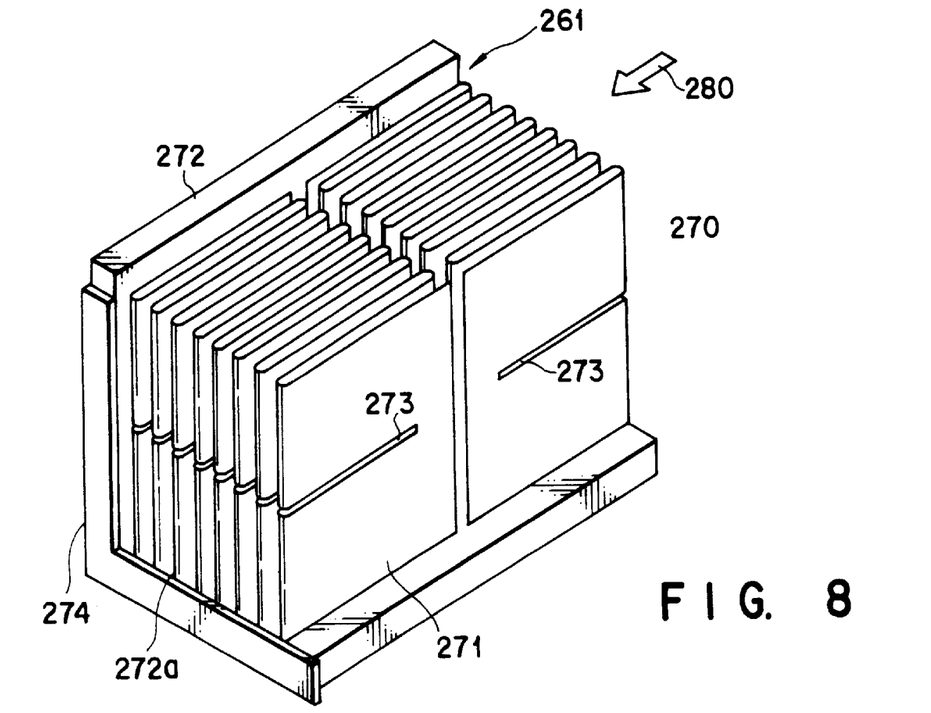
FIG. 8 is an exploded perspective view showing a case for a first filter and an element of the first filter.
Figure 9:
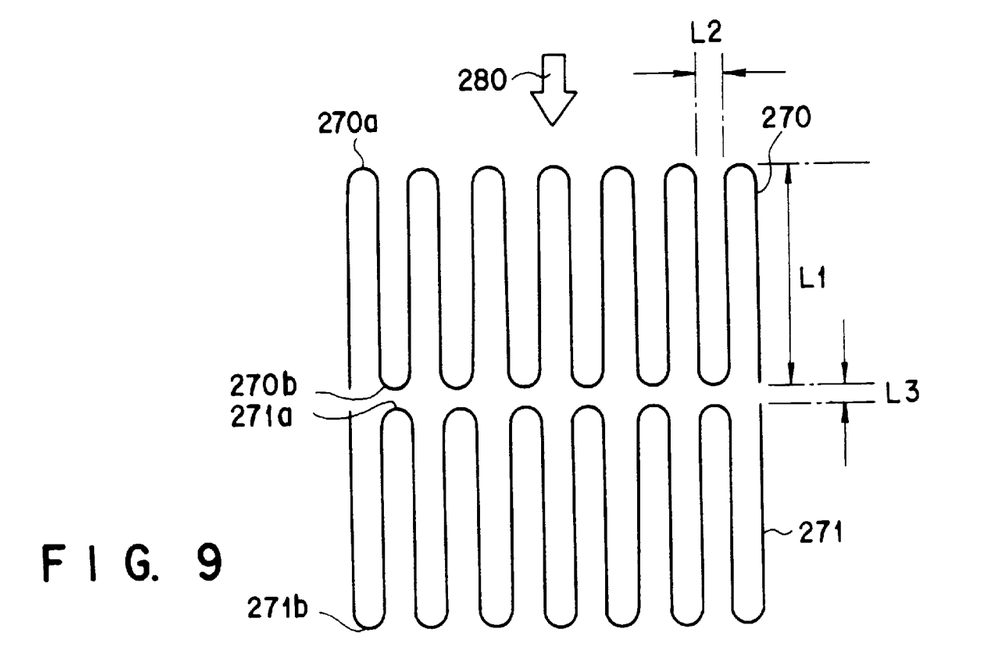
FIG. 9 is a horizontal cross sectional view showing the element of the first filter.

Another air cleaning mechanism 80 is provided for the interface section 30 so as to supply fresh air into the interface section 30. Air which is supplied to the air cleaning mechanism 80 satisfies a concentration of the alkaline component of 10 ppb or lower, which is the requirement for the interior atmosphere of the clean room 90. The concentration of the alkaline component in supplied air 280 (see FIGS. 8 and 9 is lowered to 1 ppb or lower after it has passed through the air cleaning mechanism 80.

Each of the coating section 10, the developing section 20 and the interface section 30 has an alkaline concentration analyzer 50. As shown in FIG. 2, a detection terminal 53 of the concentration analyzer 50 is disposed in the upper space of each of the sections 10, 20 and 30 to detect the concentration of the alkaline component contained in air immediately after blown out from the filter unit 80. The "alkaline component" to be detected is organic amine, such as ammonia and NMP (N-methyl.2 pyrrolidinone), and their polar molecule components.

The alkaline concentration analyzer 50 may be ion chromatography. For example, a diffusion scrubber (not shown) and an auto-exchanger (not shown) are attached to the concentration analyzer 50.

As shown in FIG. 2, a tank 52 of the alkaline concentration analyzer 50 accommodates pure water 51. An end of a sampling pipe 54 is submerged in pure water 51 in the concentration analyzer 50. Another end (detection terminal) 53 of the sampling pipe 54 is disposed above the resist coating units 15a and 15b and directly under the air blow-out opening of the air cleaning mechanism 80. An exhaust pipe 55 is submerged in pure water 51 in the concentration analyzer 50.

Detection signals output from the alkaline concentration analyzer 50 are sequentially supplied to an input portion of a CPU 60. A memory portion of the CPU 60 previously stores a predetermined threshold value. In this embodiment, the threshold value of the concentration of the alkaline component is determined to be 1 ppb.

An output portion of the CPU 60 is connected to a monitor 70 and an alarm system 71. The alkaline concentration detected in each portion is displayed on the screen of the monitor 70 so that an operator of the system is permitted to immediately recognize the state of the system. If any one of the detected concentrations exceeds the threshold value, the CPU 60 operates the alarm system 71 to issue an alarm. If the threshold value is set to be lower than 1 ppb (for example, 0.7 ppb), a chemical filter 85 can be changed prior to occurrence of defective resolution with sufficient time margin.

The CPU 60 feedback-controls the conveying machine 6 of the coating unit 10 and a drive motor 17 of a spin chuck 16. In accordance with a program transferred from the CPU 60, the process can be continued or interrupted.

Referring to flow charts shown in FIGS. 3A and 3B, an operation of the foregoing apparatus to process the wafer W will now be described.

Initially, the wafer moving mechanism 2 takes out a non-processed wafer W from the first cassette 1a of the cassette station 4 in a loader/unloader section, and then places the non-processed wafer W on the holder 3 while centering the wafer W. The main conveying machine 6 picks up the wafer W from the holder 3 by the arm 7 and holds the same to introduce the wafer W into the processing section (step S1). Then, the main conveying machine 6 introduces the wafer W into the baking unit 13 to pre-bake the wafer W in accordance with a predetermined recipe (step S2).

The wafer W is scrubbed with a brush in the scrubbing unit 11 (step S3), and then the wafer W is cleaned with jet water in the jet-water cleaning unit 14 (step S4). While heating the wafer W, the wafer W is subjected to an adhesion process in the adhesion processing unit 12a (step S5). An alkaline component generated due to the adhesion process is brought to the air-discharge passage 88 in the floor portion by the downflow air. Then, the alkaline component is absorbed and removed by an alkaline component absorbing apparatus (not shown) disposed in the circulating circuit.

Then, the wafer W is cooled in the cooling portion 12b, and then a chemically amplified resist is applied to the wafer W in the resist coating units 15a and 15b (step S8). After the pre-baking step S2, the reflection preventive resist may be applied to the wafer W (step S6) followed by baking the wafer W in accordance with the predetermined recipe (step S7). After the baking step S7 has been performed, the chemically amplified resist is further applied onto the reflection preventive film (step S8). In the resist applying steps S6 and S8, the alkaline component in supplied air is removed by the air cleaning mechanism 80 so as to lower the concentration of the alkaline component in the processing atmosphere to be lower than 1 ppb.

After the resist has been applied, the wafer W is again baked in the baking unit 13 (step S9). After the wafer W has been cooled in the cooling unit 12b, the wafer W is brought to the interface section 30 to align the position of the wafer W on the holder 31. Then, the wafer W is introduced into the exposing section 40 so as to be subjected to the exposing process (step S10).

After the exposing process has been performed, the wafer W is introduced into the baking unit 21 of the developing section 20 through the interface section 30 so as to be pre-baked before the developing process is performed (step S11). Then, the wafer W is developed in the developing unit 22 (step S12). Also the concentration of the alkaline component in the developing atmosphere is adjusted to be lower than 1 ppb by the air cleaning mechanism 80. After the developing process has been performed, the wafer W is post-baked in the baking unit 21 so that the sequential resist process is completed (step S13). The processed wafer W is moved to the cassette station 4 by the main conveying machine 6 so as to be placed on the holder 3. The wafer moving mechanism 2 accommodates the processed wafer W in the second cassette 1b. The processed wafer W is, while being accommodated in the second cassette 1b, taken out from the cassette station 4.

Figures 3A, 3B:
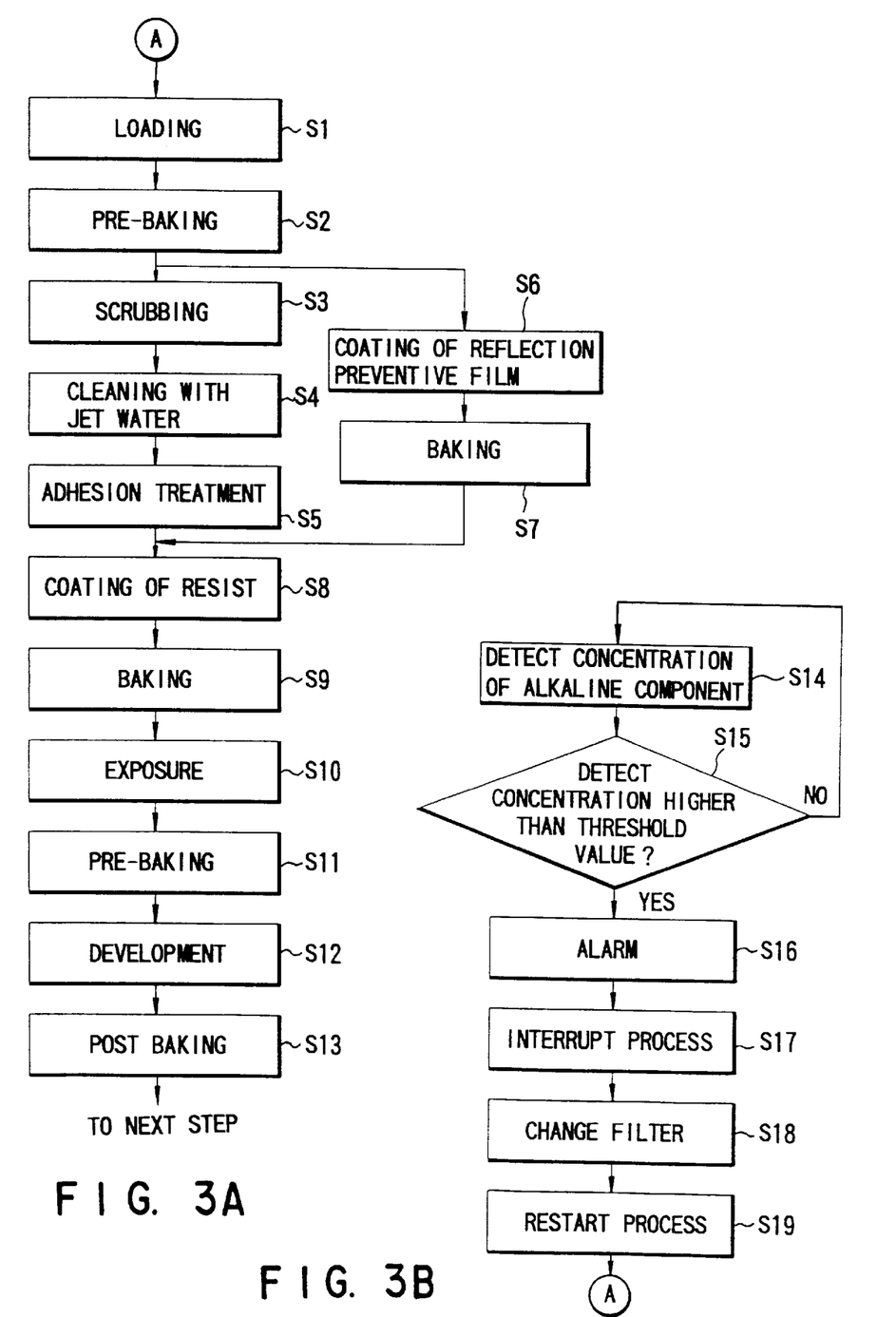
FIG. 3A is a flow chart of a method of resist-processing a substrate according to the embodiment of the present invention.
FIG. 3B is a flow chart of the ensuing portion of the method of resist-processing the substrate according to the embodiment of the present invention.

As shown in FIG. 3B, the concentration of the alkaline component in the processing atmosphere is detected by the alkaline concentration analyzer 50 and the results of the detection are, in real time, displayed on the screen of the monitor 70 (step S14). If the chemical filter 85 deteriorates after it has been used for a long time and the performance for removing the alkaline component has deteriorated, the concentration of the alkaline component in the processing atmosphere is gradually raised.

The CPU 60 compares the detected concentration of the alkaline component in the processing atmosphere and the threshold value (1 ppb) with each other. If the detected level is lower than the threshold value (1 ppb), the foregoing steps S1 to S13 are repeated (step S15). If the detected concentration of the alkaline component is higher than the threshold value (1 ppb), the CPU 60 issues a command to the alarm system 71 to issue an alarm (steps S15 and S16).

When the operator recognizes abnormal concentration of the alkaline component in the processing atmosphere in accordance with the alarm issued from the alarm system 71 and/or the screen of the monitor 70, the operator selects any one of the following methods (1), (2) and (3).

(1) A first method in which all of the processing operations are immediately interrupted (step S17), and the chemical filter 85 is changed (step S18). Then, the process is restarted (step S19).

(2) A second method in which the operations of the resist coating section 10 and the developing section 20 for processing the wafer W are interrupted. Moreover, the operations of the other processing sections 11, 12, 13, 14 and 40 for processing the non-processed wafer W are completed. Then, all of the processing operations are interrupted (step S17), and then the chemical filter 85 is changed (step S18). Then, the process is restarted (step S19).

(3) A third method in which the operations for processing all of the wafer W (including the non-processed wafer W in the first cassette 1*a* of the cassette station 4) in the resist processing system are completed. Then, all of the processing operations are interrupted (step S17), and then the chemical filter 85 is changed (step S18). Then, the process is restarted (step S19).

The first method (1) enables the wafer W to be quickly and reliably protected from being damaged by the alkaline component in the atmosphere. However, since the wafer W, which is being processed in the processing sections 10 and 20, is collectively restored, the process involves waste.

The second method (2), in which the wafer W, which is being processed in the processing sections 10 and 20, and the introduced non-processed wafer W are processed, enables the waste in the process to be prevented.

The third method (3) is able to further prevent waste in the process as compared with the second method (2). However, since a long time is required to interrupt the processing operation, there is a risk that the wafer W is damaged by the alkaline component in the atmosphere.

As described above, each of the first to third methods (1), (2) and (3) has its merits and demerits. In order to protect the wafer W from being damaged with the second method (2) or the third method (3), the threshold value of the concentration of the alkaline component in the processing atmosphere may be lowered from 1 ppb to 0.7 ppb.

Figure 4:
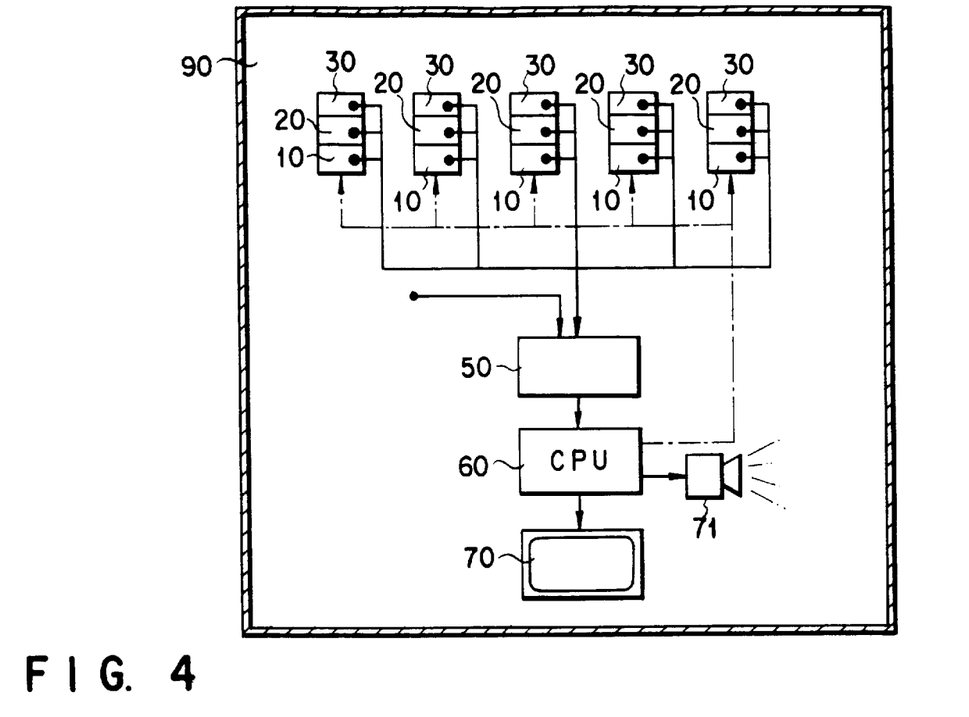
FIG. 4 is a block diagram schematically showing an apparatus according to another embodiment.

As shown in FIG. 4, a structure may be employed in which, for example, five resist processing systems are included in single clean room 90; and the atmospheres of the processing sections 10, 20 and 30 of the five resist processing systems are, in parallel, controlled by using the common alkaline component concentration analyzer 50, the CPU 60, the monitor 70 and the alarm system 71.

Since the threshold value of the concentration of the alkaline component in the atmosphere in the coating section 10, the developing section 20 and the interface section 30 and that in the atmosphere in the clean room 90 are, in this case, different from each other, the CPU 60 controls the system to be adaptable to the difference. For example, the threshold value of the concentration of the alkaline component in the former sections 10, 20, 30 is made to be 1 ppb and the threshold value of the concentration of the alkaline component in the latter section is made to be 10 ppb. By detecting the concentration of the alkaline component in the clean room 90 as well as detecting the concentration of the alkaline component in the resist processing system, the life-time of the chemical filter 85 can be predicted.

When the wafer applied with the resist and exposed to light was allowed to stand in an atmosphere containing ammonia at a concentration of about 1 ppb and an atmosphere containing ammonia at a concentration of about 10 ppb, a required width of lines of the pattern of ±0.3% was satisfied in the former atmosphere (alkaline concentration of 1 ppb). However, the pattern was deformed excessively in the latter atmosphere (alkaline concentration of 10 ppb).

The threshold value of the concentration of the alkaline component in the processing units 10 and 20 and the threshold value of the concentration of the alkaline component in the interface section 30 may be different from each other even in the same system.

Since the alkaline component is generated in the prebaking step S11 after the exposing step S10 has been performed, it is preferable that the concentration of the alkaline component in the processing atmosphere be detected at least from the resist coating step S8 to the developing step S12.

The concentration of the alkaline component may be detected at a position near a door (not shown) in the system.

Although the foregoing embodiment has been described as a structure in which the present invention is applied to the system for coating and developing resist for a semiconductor wafer, the present invention may be applied when resist is applied to a glass substrate for a LCD and the resist is developed.

According to the present invention, the concentration of the alkaline component in the processing atmosphere can be online-detected and the processing atmosphere for the substrate can quickly be improved in accordance with the detected value. Therefore, the manufacturing yield and the reliability of the apparatus can be improved.

Since the concentration of the alkaline component in the processing atmosphere is always monitored, the operator is able to predict the time at which the chemical filter must be changed and the life-time of the filter.

If the detected level of the concentration of the alkaline component in the processing atmosphere exceeds a threshold value, this fact is notified to the operator by the alarm system. Therefore, the operator is able to quickly take a countermeasure against the problem. Thus, damage of the chemically amplified resist applied to the wafer W can be prevented.

Moreover, if the detected levels of the concentrations of the alkaline components respectively detected in the coating section 10, the developing section 20 and the interface section 30 are different from one another after the recipe has been changed, the operator is able to analyze the state of the problem to detect the cause of the problem.

Referring to FIGS. 5 to 9, another embodiment of the present invention will now be described.

Figure 6:
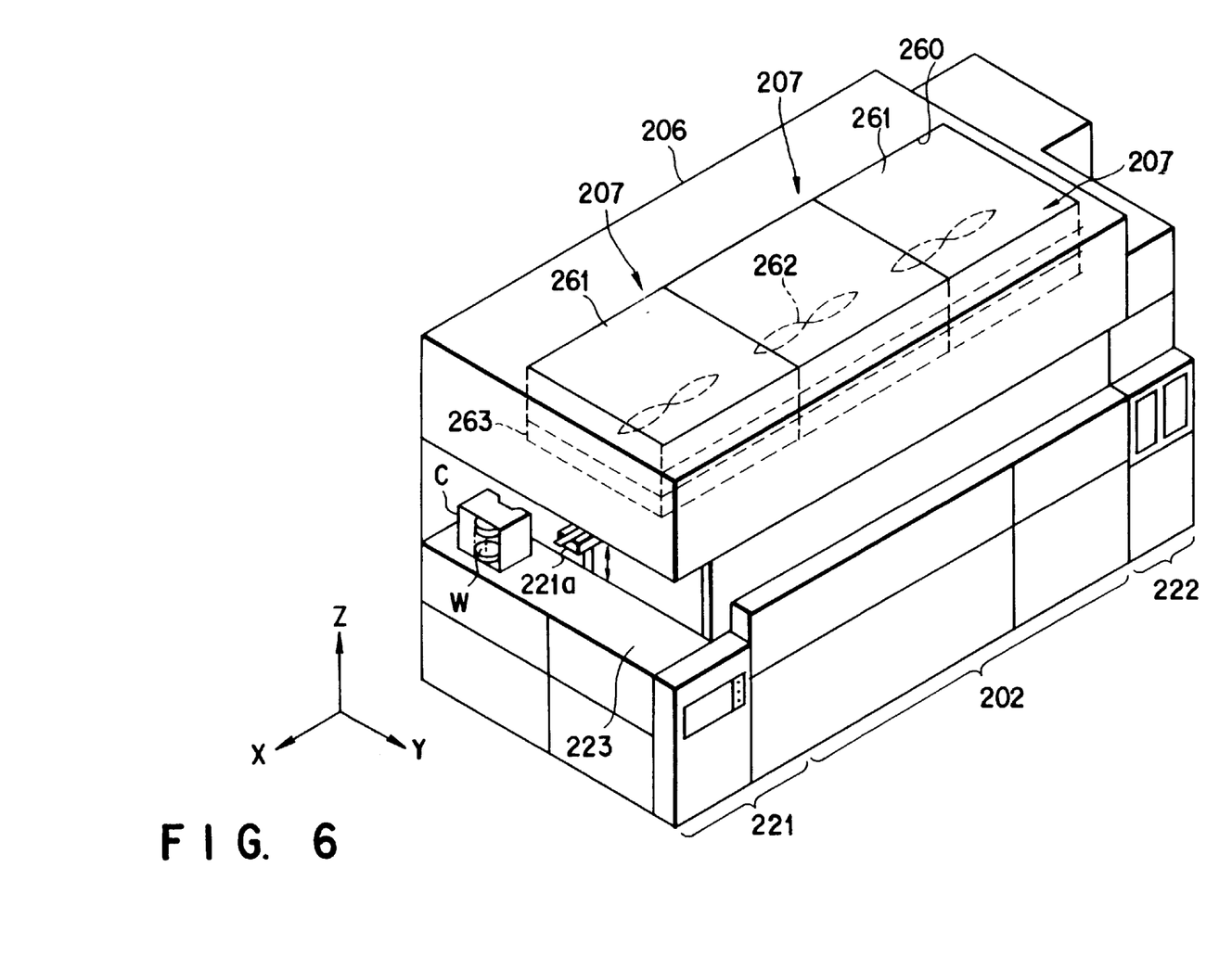
FIG. 6 is a perspective view showing the shape of a resist processing system.

As shown in FIG. 6, a resist processing system according to this embodiment has a processing section 202, a loading/ unloading section 221 and an interface section 222. An exposing portion (not shown) is connected to the interface section 222. The system is covered with a cover 206. The cover 206 has, in the upper portion, an air inlet opening 260. The air inlet opening 260 has three filter units 207. Moreover, openings for introducing a wafer are formed in the front and rear portions of the cover 206.

Punching metal plates or gratings are disposed on the floors of the processing section 202, the loading/unloading section 221 and the interface section 222. Downflow air is arranged to flow from an upper filter unit 207 to pass through the processing space so as to be introduced into a position below the floor.

Figure 5:
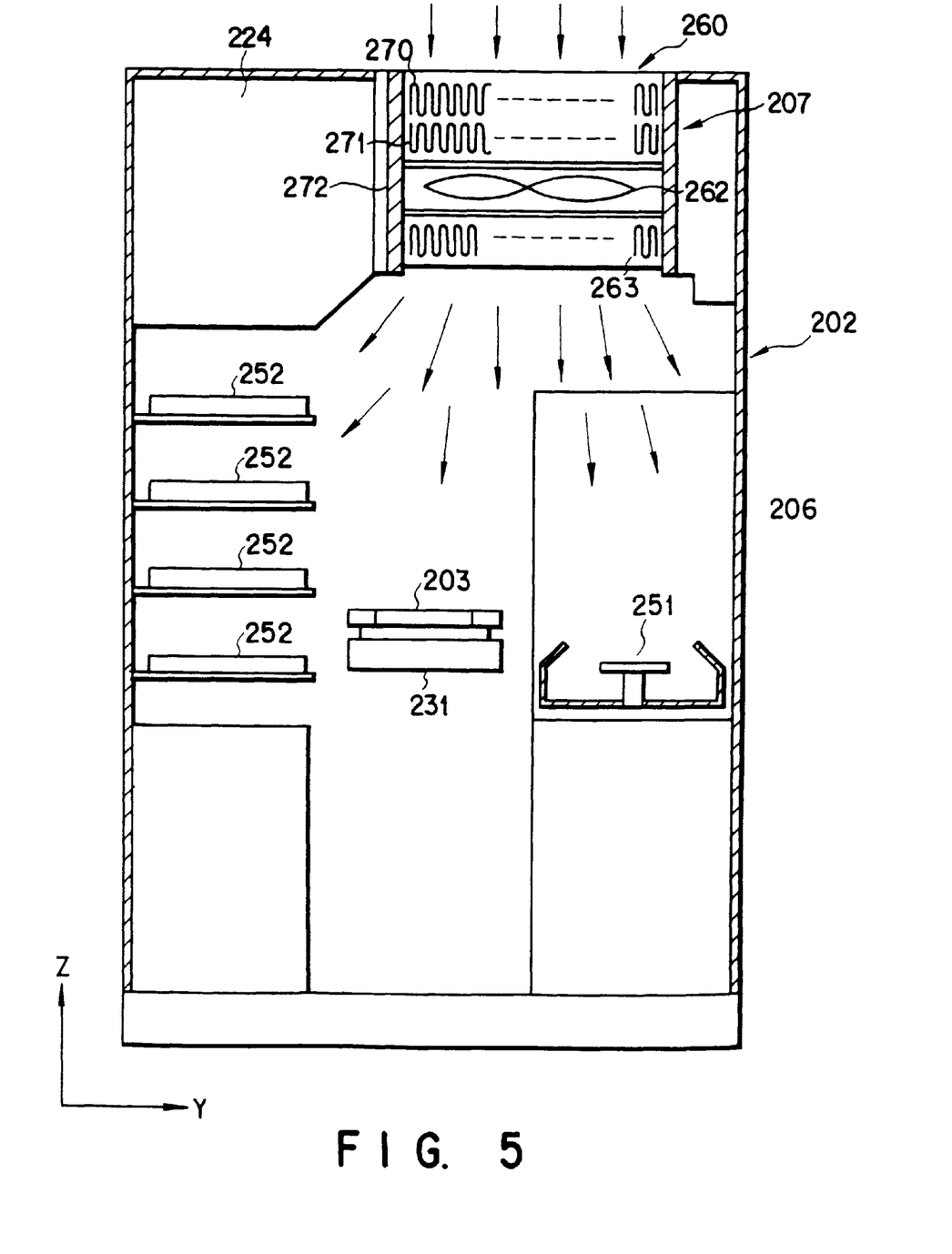
FIG. 5 is a cross sectional block diagram schematically showing the resist applying portion having the apparatus for resist-processing a substrate according to the embodiment of the present invention.

As shown in FIG. 5, the filter units 207 are surrounded by a case 272 and attached to the upper portion of the processing section 202. The outer case 272 accommodates a fan 262, a first filter portion 261 and a second filter portion 263. The first filter portion 261 is formed adjacent to the upper air inlet opening 260, while the second filter portion 263 is formed adjacent to the lower air inlet opening 260. The fan 262 is disposed between the first filter portion 261 and the second filter portion 263. Supplied air 280 is, through a common duct (not shown) of the plant, introduced into the first filter portion 261 in a direction indicated by arrows shown in FIGS. 8 and 9 to be allowed to pass through the upper first filter element 270. Then, supplied air 280 is allowed to pass through the lower fan 262 and the second filter element 271.

The second filter portion 263 acts to remove particles from supplied air and has a filter element in the form of a sheet made of glass fiber.

It is preferable that a gasket 274 be made of a material which does not considerably generate ammonia. For example, it is preferable that silicon rubber or PVC be employed. When the gasket 274 was submerged in a very pure water to measure the quantity of elution, a quantity of 20 ng/cm2 was detected. If the quantity of elution of ammonia is the foregoing level, it can be said that the gasket 274 does not substantially generate ammonia in the atmosphere.

Figure 7:
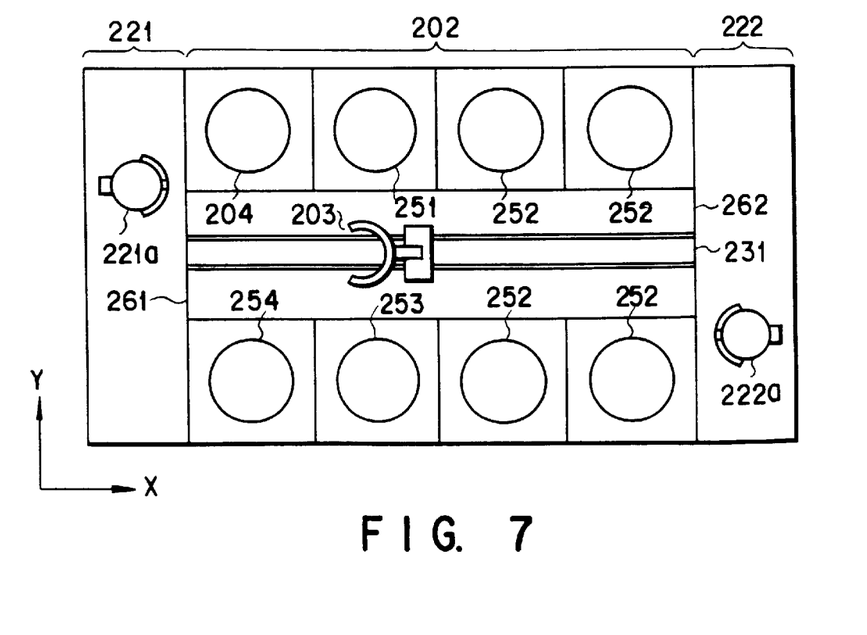
FIG. 7 is a plan view showing the resist processing system.

As shown in FIG. 7, the processing section 202 has, in the central portion thereof, a conveyance passage 231 extending in the direction of the X axis from an end 261 to another end 262. A main conveyance machine 203 is disposed so as to be capable of traveling along the conveyance passage 231. The main conveyance machine 203 has an arm for holding and moving the wafer W. The conveyance arm is able to move in the directions of the X, Y and Z axes. Moreover, the conveyance arm is able to rotate around the Z axis by an angular degree of θ.

An adhesion unit 204, a resist coating unit 251, a heating unit 252, a cooling unit 253 and a developing unit 254 are disposed on the two sides of the conveyance passage 231.

Referring to FIGS. 8 and 9, the upper first filter portion 261 will now be described.

The first filter portion 261 has filter elements 270 and 271 stacked vertically. Supplied air 280 is initially allowed to pass through the first filter element 270, and then allowed to pass through the second filter element 271.

Each of the first and second elements 270 and 271 is in the form of bellows made of a sheet, that is, projections 270a and 271a and recesses 270b and 271b are alternately repeated when viewed from supplied air 280 so as to be formed into a pleated shape. The recesses 271b of the second element are formed in the downstream portion of the projections 270a of the first element, while the projections 271a of the second element are formed in the downstream portion of the recesses 270b of the first element.

Each of the elements 270 and 271 has a slit 273 through which air passes. The slit 273 of the first filter element 270 is formed in the upstream projection 270a, while the slit 273 of the second filter element 271 is formed in the downstream recess 271b. The side portion of the second filter element 271 is, through a seal layer 272a, attached to a support frame 272.

The first and second elements 270 and 271 have substantially the same size. For example, length L1 in the direction in which air flows is made to be about 70 mm, bending interval L2 is made to be a pitch of about 4 mm, and the gap L3 is made to be about 5 mm or less. A gasket 274 is attached to a support frame 272 adjacent to the air outlet opening. Each of the first and second elements 270 and 271 is made of a carbon fiber sheet or an olefin fiber sheet. The foregoing fiber sheet is impregnated with phosphoric acid solution.

A method of manufacturing the first and second elements 270 and 271 will now be described.

Initially, the fiber sheet is submerged in phosphoric acid solution, and then the fiber sheet is set to a centrifugal separator so as to centrifugally separate and remove an excessive amount of the phosphoric acid solution. Then, the fiber sheet is pressed so as to be formed into a plate form. As a result of the pressing operation above, the concentration of small pores in the fiber sheet can be raised so that the shapes of the small pores are uniform. Thus, the small pores are arranged regularly and the specific surface area can be enlarged.

As expressed by the formula (1) below, the ammonia component in supplied air 280 reacts with phosphoric acid contained in the first and second elements 270 and 271 and is thus captured. When supplied air 280 has passed through the first filter portion 261, the concentration of ammonia is finally lowered to a level of about 0.1 ppb.

$$NH_3 + H_3PO_4 \rightarrow (NH_4)H_2PO_4 \tag{1}$$

Although the performance of the first filter element 270 for removing ammonia deteriorates gradually due to use for a long time, the wanting of the removal performance of the first filter element 270 can be compensated by the second filter element 271.

Consumption of phosphoric acid takes place in the order as the projection 270a of the first element, the recess 271b of the second element, the recess 270b of the first element and the projection 271a of the second element. Note that the differential of the consumption rate of the phosphoric acid between the projection 271a and the recess 271b is small. Therefore, the synergistic effect of the difference in the consumption rate of the phosphoric acid between the two portions and the difference in the start timing for the consumption of the phosphoric acid between the same reduces the scattering of the quantity of the consumption of the phosphoric acid between the projection 271a and the recess 271b. As a result, the second filter element 271 is uniformly aged and the life of the second filter element 271 is longer than that of the first filter element 270.

When the first filter portion 261 is changed, the first and second first filter elements 270 and 271 may be changed simultaneously. As an alternative to this, the second filter element 271, which is able to work, may be allowed to be retained and only the first filter element 270 may be changed.

As described above, according to this embodiment, the life-time of the chemical filter can significantly be elongated. Therefore, the frequency, at which the filter must be changed, can be lowered.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of forming a resist on a substrate and processing the resist in a resist processing system having a processing region and a non-processing region which are air-conditioned using a filter, said method comprising the steps of:

(a) transferring the substrate from the non-processing region to the processing region;

(b) coating the resist on the substrate;

(c) exposing the coated resist;

(d) developing the exposed resist;

(e) subjecting the coated resist, at least once, to heat treatment in a period from said step (b) to said step (d);

(f) detecting, at least once, the concentration of an alkaline component which causes defective resolution of the resist in an atmosphere of the resist processing system in a period from said step (b) to said step (d);

(g) setting a threshold value for the concentration of the alkaline component in the atmosphere of the resist processing system which causes the defective resolution of the resist;

(h) displaying, when a value detected in said step (f) exceeds the threshold value set in said step (g), this fact, or issuing an alarm, and interrupting an operation for processing the substrate in at least said processing region; and (i) replacing a chemical filter for removing the alkaline component contained in conditioned air to be supplied into said processing region by a new chemical filter, and resuming the operation for processing the substrate after the chemical filter has been replaced.

2. A method according to claim 1, wherein in said step (h), the atmosphere of the resist processing system in at least one of said steps (b) to (e) is controlled on the basis of the value detected in said step (f) and the threshold value set in said step (g).

3. A method according to claim 1, wherein the chemical filter includes a first filter element and a second filter element which are disposed vertically and disposed such that supplied air is allowed to pass through said first filter element and then allowed to pass through said second filter element.

4. A method according to claim 1, wherein when the value detected in said step (f) exceeds the threshold value set in said step (g), all operations for processing all of substrates existing in the processing region are interrupted in said step (h).

5. A method according to claim 1, wherein when the value detected in said step (f) exceeds the threshold value set in said step (g), all operations for processing all substrates existing in the processing region and the non-processing region are continued, and the processing operations in the processing region and the non-processing region system are interrupted after the operations for processing all of the substrates have been completed.

6. A method according to claim 1, wherein when
a plurality of substrates are simultaneously processed by using a plurality of resist processing systems, the concentration of alkaline component in the atmosphere in each resist processing system is detected in said step (h), and information of concentration of alkali in the atmosphere in each resist processing system, obtained from each detection value, is displayed or an alarm is issued in said step (h) when at least one of the detected values exceeds the threshold value.

7. A method according to claim 1, wherein an allowable upper limit of deviation of the values detected in said step (f) is set in said step (g), and, when a difference in the detected value of the concentration of the alkaline component between individual atmospheres in the resist processing system exceeds said allowable upper limit set in the step (g), the concentration of the alkaline component under said atmosphere is detected again in said step (f).

8. A method according to claim 1, wherein in
said step (g) a threshold value of the concentration of the alkaline component in the processing region is made to be different from a threshold value of the concentration of the alkaline component in the non-processing region in the same resist processing system.

9. A method according to claim 1, wherein integrated information of detected concentrations of the alkaline component in the processing atmosphere is obtained in said step (f) by repeatedly detecting the concentration of the alkaline component in the processing atmosphere from said step (a) to said step (d).

10. A method according to claim 1, wherein the threshold value of the concentration of the alkaline component included in the conditioned air introduced into the processing region is set to be lower than 1 ppb in said step (g).

11. A method according to claim 1, further comprising a step of adhesion-processing the surface of the substrate before the resist coating step (b) is performed.

12. A method according to claim 1, wherein in said steps (b) to (e) air is exhausted from said processing region, to thereby remove an alkaline component contained in the air, and then the air is circulated into said processing region.

13. A method according to claim 1, wherein in said step (f), the concentration of the alkaline component in a PEB (Post Exposure Bake) processing atmosphere for baking the resist after exposure is detected.

14. A method according to claim 1, wherein the chemical filter includes a first filter element and a second filter element which are disposed vertically and disposed such that supplied air is allowed to pass through the first filter element and then allowed to pass through the second filter element.

15. A method of forming a resist on a substrate and processing the resist in a resist processing system having a processing region and a non-processing region which are air-conditioned using a filter, said method, comprising the steps of:

(A) transferring the substrate from the non-processing region to the processing region;

(B) coating the resist on the substrate in said processing region;

(C) exposing the coated resist in said processing region;

(D) developing the exposed resist in said processing region;

(E) subjecting the coated resist, at least once, to heat treatment in a period from said step (B) to said step (D);

(F) detecting, at least once, the concentration of an alkaline component which causes defective resolution of the resist in an atmosphere of the resist processing system in a period from said step (B) to said step (D);

(G) detecting the concentration of an alkaline component contained in an atmosphere of an external environment of said resist processing system;

(H) setting a threshold value for the concentration of an alkaline component in the atmosphere of the resist processing system which causes the defective resolution of the resist;

(I) setting a threshold value of the concentration of the alkaline component contained in the atmosphere of said external environment which causes defective resolution of the resist;

(J) displaying, when a value detected in said step (F) exceeds the threshold value set in said step (H), this fact, or issuing an alarm, and interrupting an operation for processing the substrate in at least said processing region; and (K) replacing a chemical filter for removing the alkaline component contained in conditioned air to be supplied into said processing region by a new chemical filter, and resuming the operation for processing the substrate after the chemical filter has been replaced.

16. A method according to claim 15, wherein when a value detected in said step (F) exceeds the threshold value in at least one of said step (H), at least one processing atmosphere in at least one of said steps (A) to (E) is feedback-controlled in said step (J) to make the detected value in said step (F) lower than the threshold value in said step (H).

17. A method according to claim 15, wherein when the value detected in said step (F) exceeds the threshold value set in said step (H), all operations for processing all of substrates existing in the processing region and the non-processing region are interrupted in said step (J).

18. A method according to claim 15, wherein when the value detected in said step (F) exceeds the threshold value set in said step (H), all operations for processing all of substrates existing in the processing region are interrupted.

19. A method according to claim 15, wherein when the value detected in said step (F) exceeds the threshold value set in said step (H), all operations for processing all substrates existing in the processing region and the non-processing region are continued, and the processing operations in the processing region and the non-processing region in the resist processing system are interrupted after the operations for processing all of the substrates have been completed, in said step (J).

20. A method according to claim 15, wherein a plurality of substrates are simultaneously processed by using a plurality of resist processing systems, the concentration of alkaline component in the processing atmosphere in each resist processing system is detected in said step (F), and information of concentration of alkaline component in the processing atmosphere in each of said resist processing systems, obtained from each detection value, is displayed or an alarm is issued in said step (J) when at least one of the detected values exceeds the threshold value.

21. A method according to claim 15, wherein an allowable upper limit of deviation of the values detected in said step (F) is set in said step (H), and, when a difference in the detected value of the concentration of the alkaline component between individual atmospheres in the resist processing system exceeds said allowable upper limit set in the step (H), the concentration of the alkaline component under said atmosphere is detected again in said step (F).

22. A method according to claim 15, wherein a threshold value of the concentration of the alkaline component in the processing region is made in said step (H) to be different from a threshold value of the concentration of the alkaline component in the non-processing region in the same resist processing system.

23. A method according to claim 15, wherein integrated information of detected concentrations of the alkaline component in the processing atmosphere is obtained in said step (F) by repeatedly, detecting the concentration of the alkaline component in the processing atmosphere from said step (A) to said step (C).

24. A method according to claim 15, wherein the threshold value of the concentration of the alkaline component included in the conditioned air introduced into the processing region is set to be lower than 1 ppb in said step (H).

25. A method according to claim 15, further comprising;

a step for adhesion-treating the surface of the substrate before the resist coating step (B) is performed.

26. A method according to claim 15, wherein in said steps (B) to (E) air is exhausted from said processing region, to thereby remove an alkaline component contained in the air, and then the air is circulated into said processing region.

27. A method according to claim 15, wherein in said step (F), the concentration of the alkaline component in a PEB (Post Exposure Bake) processing atmosphere for baking the resist after exposure is detected.

28. A method according to claim 15, wherein the chemical filter includes a first filter element and a second filter element which are disposed vertically and disposed such that supplied air is allowed to pass through the first filter element and then allowed to pass through the second filter element.

* * * * *